March 16, 1965 O. SCHMIDT 3,173,815

METHOD OF FLOAT ZONE MELTING A DOPED ROD OF SEMICONDUCTOR MATERIAL

Filed Jan. 22, 1963

3,173,815

METHOD OF FLOAT ZONE MELTING A DOPED ROD OF SEMICONDUCTOR MATERIAL

Otto Schmidt, Erlangen, Germany, assignor to Siemens-Schuckertwerke Aktiengesellschaft, Erlangen, Germany, a German corporation Filed Jan. 22, 1963, Ser. No. 253,079
Claims priority, application Germany, Jan. 26, 1962, S 77,717
3 Claims. (Cl. 148—176)

My invention relates to a method for producing a rod of highly pure semiconductor material, preferably silicon, for electronic purposes. In a more particular aspect, the invention relates to the production of pure semiconductor rods, for example of silicon, that contain a prescribed concentration of doping substance, such as phosphorus, whose distribution coefficient is smaller than unity and whose vapor pressure is above that of the semiconductor material, the dopant being approximately uniformly distributed over the entire length of the rod by crucible-free (floating) zone melting in a vacuum.

The doped semiconductor rods to be zone-melted may be obtained, for instance, in accordance with a known process by pyrolytic decomposition of a gaseous compound of the semi-conductor substance and precipitation of the resulting material on an electrically heated core rod of the same semiconductor material, the doping substance being added during pyrolytic dissociation and precipitation. Such addition of dopant may be effected, for instance, by adding a gaseous compound of the dopant to the reaction gas mixture, the dopant having a distribution coefficient in the semicoductor material smaller than unity. The concentration of the dopant in the precipitated semicoductor material can subsequently be reduced by zone melting.

The dopant concentration of such a rod can also be subsequently reduced, in accordance with a method known from U.S. Patent 2,970,111, by subjecting a doped rod, whose cross section can first be reduced by a drawing-thin operation, to further pyrolytic precipitation of undoped semiconductor material, thus again thickening the rod. The cross-sectional ratio between the doped core and the undoped thickening layer can be chosen at will, so that a desired average value of dopant concentration relative to the entire rod volume is obtained.

Semiconductor rods previously prepared for approximately uniform dopant concentration over the length of the rod, must often be further processed by zone melting, either for converting the rod to monocrystalline constitution, for uniformly distributing the dopant concentration over the rod cross section, or for reducing the dopant concentration as mentioned above. Due to the fact that the distribution coefficient of the dopant differs from the unity value, such zone-melting processes have the consequence of impairing the uniformity of longitudinal dopant distribution in the rod portion first traversed by the molten zone. It is known to reestablish uniformity of longitudinal distribution by the so-called zone-leveling method which comprises subjecting the rod to a number of zone-melting passes in alternating directions.

It is an object of my invention to afford the production of electronic semiconductor rods with dopants of less than unity distribution coefficient and uniform longitudinal distribution by a process that can be performed in a simpler manner and secures better and more economical yields than heretofore attained.

According to my invention, the doped semiconductor rod, for example a rod of electronically pure silicon that contains phosphorus as dopant, is subjected in vacuum to floating-zone melting passes that are all carried out in the same advancing direction along the rod, but during this process, one of the zone passes is commenced at the distance of approximately one-half the rod diameter away in the pass-advancing direction from the normal starting point of the other passes. Furthermore, after the pass commencing at the displaced starting point is completed, at least one further pass is performed back from the normal starting point and hence over the normal and longer pass-travel direction than the preceding shortened pass.

The invention will be further described with reference to the accompanying drawings in which.

The principles of zone-melting operation as well as various forms of necessary equipment are well known as such and need not be described herein. If desired, reference may be had, for example, to U.S. Patent 3,030,-194 of R. Emeis, assigned to the assignee of the present invention, for an illustration and description of suitable equipment.

Figure 1:
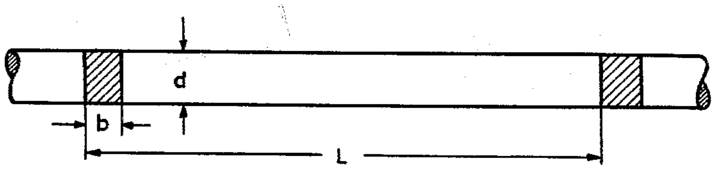
FIG. 1 is a partial view of a semiconductor rod to be subjected to floating-zone melting in accordance with the invention.

As a rule, it is preferred to have the molten zone, such as produced by an axially narrow induction heater, travel upwardly along the semiconductor rod held at both ends. In FIG. 1 of the accompanying drawing, however, the rod, for convenience, is schematically shown horizontally, and the travel direction of the molten zone during an active pass is from the left toward the right. Indicated is a molten zone having a short length $b$ in the axial direction of the rod, and a diameter $d$ depending upon the diameter of the rod. The portion of the semiconductor rod along which the molten zone is to be passed has the length L. Along this entire length L, the rod has a constant or at least approximately constant diameter.

Figure 2:
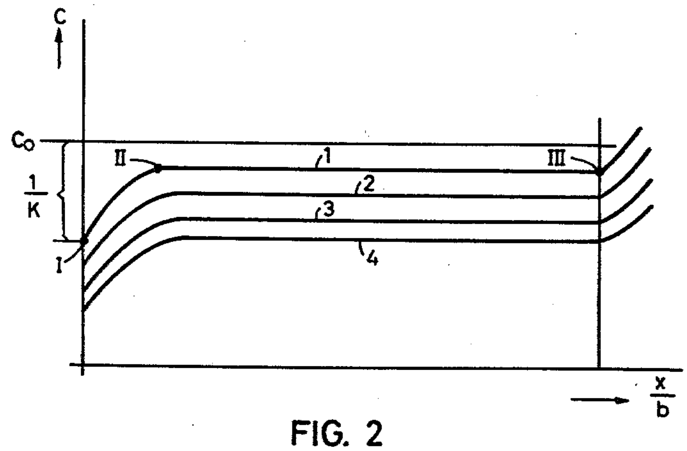
FIGS. 2 and 3 are explanatory graphs indicating the dopant concentration plotted over the length of the rod before and after zone melting according to a known method (FIG. 2) and according to the method of the invention (FIG. 3).

In the graph of FIG. 2, the dopant concentration C is plotted over the path $x/b$ traveled by the molten zone. The rod initially has a dopant concentration $C_0$ which is approximately the same along the entire length L of the rod. During the first zone travel pass, the dopant concentration corresponds to curve 1. The corresponding concentration curves for the second, third and fourth passes are denoted by 2, 3 and 4 respectively. After completion of the first pass, the concentration at the commencement of the travel path is reduced by the factor $k$ ($k$=distribution coefficient) and otherwise exhibits the known course (curve 1), apparent for example in FIG. 5 of the published German patent application DAS 1,032,555. In practice, only the portion of the semiconductor rod which, after termination of the entire zone-melting process preserves a uniform dopant concentration, can be usefully employed. Consequently, in the example represented in FIG. 2, the rod portions from I to II and the portion following point III must be considered as waste.

Figure 3:
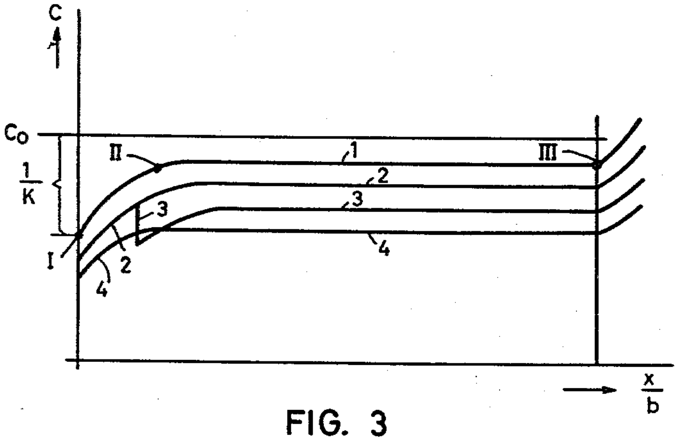

The corresponding graph in FIG. 3 exemplifies the performance of the method according to the invention. Here again the rod initially has an approximately uniform dopant concentration $C_0$. Subsequent to the first zone pass, the concentration at the beginning of the zone travel (curve 1) is also decreased by the factor $k$. Upon completion of the second zone pass (curve 2,) a further decrease by the same factor $k$ is observed. The third pass, however, is commenced as required by the invention, namely at a point which is displaced from the normal starting point I toward the right a distance corresponding to approximately one-half the rod diameter. That is, the lower and upper limits within which the starting point may be displaced for the purpose of the invention are about one-fifth and about twice the rod diameter. Due to the displaced starting point of the third pass, no further purification of the semi-conductor material with respect to the particular dopant is effected, and the dopant concentration exhibits the course denoted by curve 3. If now the fourth and last zone pass is commenced at the normal starting point, the dopant concentration, upon completion of the last pass, exhibits the course denoted in FIG. 3 by curve 4.

A comparison of curve 4 in FIG. 2 with curve 4 in FIG. 3 will show the advantage of the invention. The semiconductor rod processed in accordance with the invention (FIG. 3) shows a considerably better uniformity of dopant concentration over the processed length. That is, the waste pieces are considerably shorter. For example, a silicon rod of about 12 mm. diameter, donor doped with phosphorus, was subjected to the above-described process according to the invention. The zone-travel speeds employed and found well suitable for the purpose of the invention were about 2 to about 6 mm. per minute. With such an operation a considerable improvement was achieved. For example, a phosphorus-doped silicon rod of approximately 30 cm. length and subjected to crucible-free zone melting in vacuum in accordance with the known method as described above with reference to FIG. 2, resulted in a waste piece at the starting end of the rod of about 7 cm. length. However, when the same rod was processed in accordance with the invention (FIG. 3) the corresponding waste piece at the starting end had a length of only 2 cm. The dopant concentration ($C_0$) before applying the process was, for example, approximately $10^{-8}$ g. phosphorus per gram of silicon, and after the fourth zone pass the concentration ($C_4$) was approximately $10^{-9}$ g. phosphorus per g. silicon. Considered as waste was that portion of the silicon rod in which the mentioned concentration values exceeded the limits of $\pm 10\%$.

The method according to the invention, therefore, results in a considerably improved yield and thus affords greatly improved economy with respect to material and utilization of plant equipment.

The method of the invention can be modified in various respects. For example, when applying a large number of zone passes, the starting point of a zone pass can be repeatedly displaced away from the normal starting point in the travel direction of the passes. For example, in cases where a total of ten zone passes is applied, the fifth and ninth passes of the molten zone may thus be started a distance of approximately one-half rod diameter away from the normal starting point. Depending upon the degree of dopant concentration, the distance of the displaced starting points may also be varied to some extent, the most favorable values being ascertainable by sample testing.

The zone-melting process according to the invention is preferably performed in vacuum of less than $10^{-3}$ mm. Hg, and this vacuum is maintained by continuous pumping during the entire zone-melting process. It is of advantage to make certain that the length or portion of the rod to be subjected to the zone-melting process according to the invention have a uniform or substantially uniform diameter. If necessary, such uniformity in diameter can be obtained by previously subjecting the rod or rod portion to preparatory crucible-free zone melting in the manner known for such purposes.

The process of the invention is particularly well applicable to silicon. Germanium can be treated in the same manner. For both materials, the known acceptors and donors from the third or fifth groups of the periodic system of elements are suitable as dopants, particularly gallium, indium, arsenic and phosphorus.

I claim:

1. The method of producing a rod of hyperpure electronic semiconductor material containing uniformly distributed dopant having a distribution coefficient less than unity and a vapor pressure higher than that of the semiconductor material, which comprises subjecting the doped rod in vacuum to floating-zone melting passes, all in the same longitudinal direction, commencing one of said passes at a distance of approximately one-half the rod diameter away in the pass-advancing direction from the normal starting point of the other passes, and thereafter performing at least another one of said passes from said normal starting point.

2. The method of producing a rod of electronically pure material from the group consisting of silicon and germanium and containing dopant selected from the group consisting of gallium, indium, arsenic and phosphorus, comprising the steps of subjecting the doped rod in vacuum of less than $10^{-3}$ mm. Hg to floating-zone melting in a number of passes all in the same longitudinal direction, commencing one of said passes at a distance of approximately one-half the rod diameter away in the pass-advancing direction from the normal starting point of the other passes, and thereafter performing at least another one of said passes from said normal starting point.

3. The method of producing a rod of electronically pure silicon doped with phosphorus, which comprises subjecting the silicon rod in vacuum of less than $10^{-3}$ mm. Hg to floating-zone melting passes at an advancing rate of about 2 to about 6 mm. per minute in the same longitudinal direction, commencing the penultimate passes at a distance between one-third to twice the rod diameter away in the pass-advancing direction from the normal starting point of the other passes, and thereafter performing the last of said passes from said normal starting point.

References Cited by the Examiner

UNITED STATES PATENTS 2,739,088 3/56 Pfann ---------------- 148—1.5

DAVID L. RECK, *Primary Examiner.*